United States Patent
Bora et al.

[11] Patent Number: 4,761,881
[45] Date of Patent: Aug. 9, 1988

[54] SINGLE STEP SOLDER PROCESS

[75] Inventors: Muhammad-Yusuf J. Bora, Austin; Karl G. Hoebener, Georgetown, both of Tex.

[73] Assignee: International Business Machines Corporation, Armonk, N.Y.

[21] Appl. No.: 907,266

[22] Filed: Sep. 15, 1986

[51] Int. Cl.$^4$ .............................................. H05K 3/34
[52] U.S. Cl. .................................. 29/840; 228/180.1; 361/400
[58] Field of Search ................. 29/832, 840; 174/68.5; 361/400; 128/180.1

[56] References Cited

U.S. PATENT DOCUMENTS

| | | | |
|---|---|---|---|
| 3,832,769 | 9/1974 | Olyphant, Jr. et al. | 29/832 |
| 4,051,550 | 9/1977 | Seno et al. | 29/840 X |
| 4,139,881 | 2/1979 | Shimizu et al. | 228/180.1 X |
| 4,196,839 | 4/1980 | Davis | 228/180.1 |
| 4,215,025 | 7/1980 | Packer et al. | 29/840 X |
| 4,373,259 | 2/1983 | Motseh | 29/840 |
| 4,506,443 | 3/1985 | Itoh | 29/840 |
| 4,515,304 | 5/1985 | Berger | 228/136 |
| 4,642,889 | 2/1987 | Grabbe | 29/840 |

FOREIGN PATENT DOCUMENTS

| | | | |
|---|---|---|---|
| 2556550 | 6/1985 | France | 29/832 |
| 1199231 | 7/1970 | United Kingdom | 361/400 |

OTHER PUBLICATIONS

IBM Tech. Discl. Bulletin, vol. 24, No. 2, Jul. 1981, pp. 1214–1215 by L. V. Auletta et al.

Primary Examiner—Timothy V. Eley
Assistant Examiner—Carl J. Arbes
Attorney, Agent, or Firm—Andrea P. Bryant

[57] ABSTRACT

A technique is disclosed for attaching a variety of device types to the same side of a printed circuit board including a single solder application step for both surface mountable and leaded components, placement of the devices, drying of the solder and solder reflow.

2 Claims, 3 Drawing Sheets

4,761,881

SINGLE STEP SOLDER PROCESS

TECHNICAL FIELD

The present invention relates to attaching components to printed circuit cards. More specifically, it relates to a single step soldering technique for attaching leadless or leaded through hole and leaded surface mount components on the same side of a printed circuit card.

BACKGROUND ART

Conventional techniques for populating printed circuit boards (PCB) with a variety of component types, such as leadless, leaded through hole and surface mountable, require several process steps. Traditionally, different attachment techniques are used for each type of component.

Leaded components are frequently inserted into holes through the PCB. The assembly is then passed over a solder wave.

Surface mount attachment requires depositing solder loaded flux on the PCB component site, placing components on the PCB into the wet Solder paste, or using an adhesive to hold the component on the PCB drying the solder paste, reflowing the Solder paste, using vapor phase, infrared radiation (IR), or convection heat. The final step is cleaning using an appropriate solvent to remove flux and ionic residues.

When it is desired to have these two and/or additional types of components on the same circuit board the difficulty of reliably attaching each type in a sequence determined to avoid adverse effects on the joints for the other types becomes very difficult.

U.S. Pat. No. 4,515,304 issued to Berger illustrates a prior art method of mounting leaded and surface mountable components on the same printed circuit board. However, this reference teaches mounting the leaded components on one side by inserting their leads into through holes, crimping the lead ends, turning the board over, applying solder paste using individual applicator nozzles to the lead ends and to surface mount solder pads on the opposite side. The surface mountable components are then positioned and the whole board reflow soldered. It is indicated that the process may be repeated if it is desired to have surface mountable components on the same side as the leaded components.

DISCLOSURE OF THE INVENTION

One aspect of the present invention provides a simpler technique than that of the prior art for populating a printed circuit board PCB with a given side of a variety of component types. In the present invention solder is applied in one pass to the surface mount component pads and into the plated through holes (PTHs) in which the leaded components will be placed. The components are placed into the wet Solder paste on the PCB. The assembly is dried to remove the volatiles from the solder paste and the solder is then reflowed.

In this way a simple, single solder step process is provided for attaching a variety of component types with great flexibility, reliability and decreased cost. The lessened cost results from the reduction of required steps which also decreases results from the reduction of required steps which also decreases the opportunity for defects in handling and process operations.

Another embodiment of this invention employs the above described process, having the flexibility to place pin-in-hole (PIH) components at any position, to allow components to be mounted on both sides of the PCB. With this process, two solder applications are required, however only one reflow operation is used. For double side mounting the reverse, back, side of the PCB is processed first. Solder is applied to the surface mount component pads, adhesive is dispensed at each component site, the components are placed into the wet solder paste and onto the adhesive and the adhesive is cured, this curing holds the components to the PCB. This also partially dries the solder paste. The PCB is flipped to the top side and processed as described above, for both PIH and surface mount components.

BRIEF DESCRIPTION OF THE DRAWINGS

The invention will be better understood having reference to the following description taken with the accompanying drawing in which the same reference numerals are used throughout to designate the same parts and wherein.

BEST MODE FOR CARRYING OUT THE INVENTION

Figure 1:
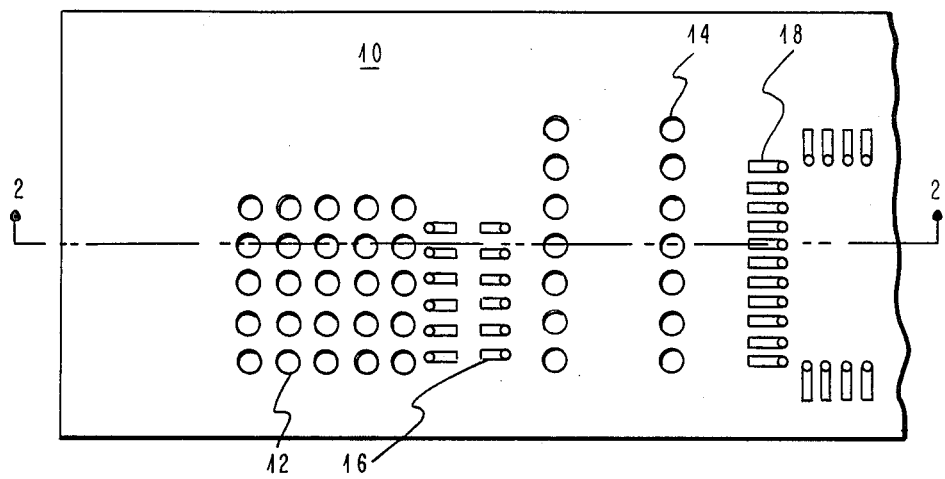
FIG. 1 is a schematic plan view of a printed circuit board.

Refer now to FIG. 1. A PCB 10 is shown schematically viewed from above. A pattern of PTHs 12 is shown. PTHs 12 are provided, for example, for accepting a Pin Grid Array (PGA) component type. A pattern of PTHs 14 is provided for accepting a dual inline package (DIP). Lands 16 are illustrated for a small outline (SO) package, and lands 18 are shown in a pattern corresponding to that of a plastic leaded chip carrier (PLCC).

Figure 2:
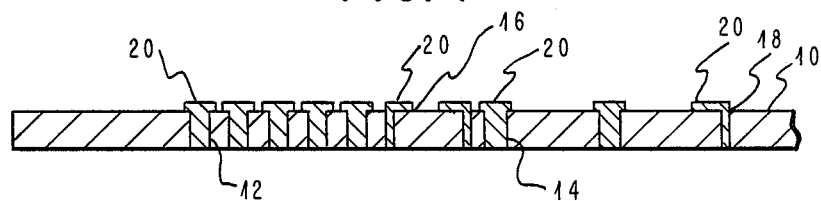
FIG. 2 is a cross-section taken along the arrows 2 in FIG. 1.

FIG. 2 shows in cross-section the printed circuit board 10 after a predetermined amount of solder paste 20 has been applied to fill PTHs 12 and 14 and to cover surface mount lands 16 and 18. Solder may be controllably applied as disclosed in co-pending, commonly assigned application Ser. No. 907,265.

Figure 3:
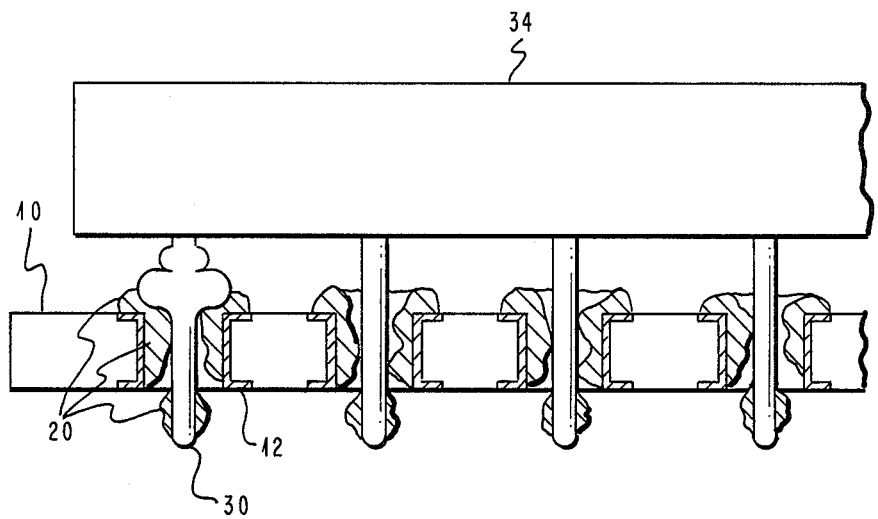
FIG. 3 shows a partial cross-section of a circuit board with a leaded PGA, placed into the wet solder paste.
Figure 4:
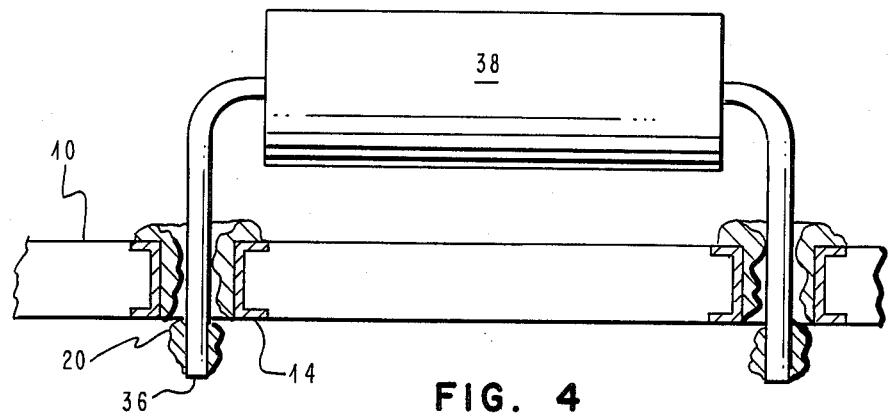
FIG. 4 shows a partial cross-section of a circuit board with a leaded DIP placed in wet solder paste.
Figure 5:
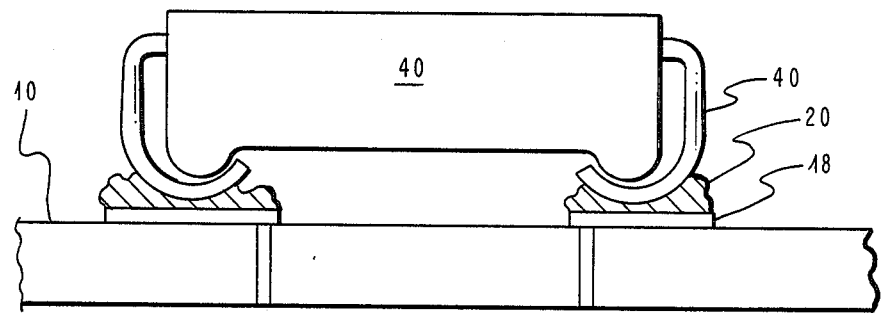
FIG. 5 shows a partial cross-section of a circuit board with a surface mount component placed in wet solder paste.

FIG. 3 is a cross-sectional view of the printed circuit board 10 with PTHs 12 having solder 20 partially pushed through by the pins 30 of the PGA module 34. In FIG. 4 PTHS 14 are similarly filled with pins 36 from DIP 38 and solder 20. A surface mount component 40 with a J lead 42 is shown in FIG. 5 with solder 20 on surface mount land 18.

If the solder paste is a solder loaded flux then a curing step is required at this point in the inventive process. The assembled card is baked to remove the volatiles from the solder paste. The drying is a critical process. Typically drying for surface mounted components on PCBs ranges from no drying to a maximum of 30 minutes at 80° c. For this example employing surface mounted and PIH components in solder paste a drying time of 45 minutes at 80° c. appears to be best suited for achieving reliable reflowed solder joints for both surface mounted and PIH components on PCBs. This step also facilitates handling of the populated board because the baked solder paste retains the electronic components in position.

After the cure step, solder is reflowed. A variety of reflow processes are available such as vapor phase, convection heating or IR. If necessary, the populated, reflowed card is cleaned by means of solvents and procedures appropriate for the flux used. This, of course, is a conventional process step.

Figure 6:
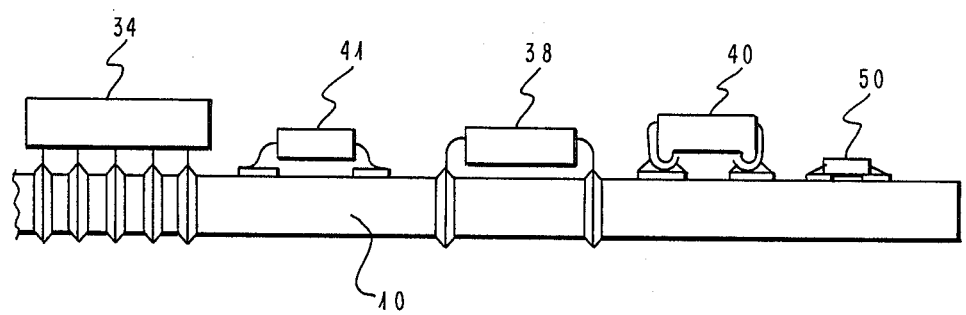
FIG. 6 is a side view of single sided PCB assembly with a variety of component types.

FIG. 6 is a single sided PCB 60 assembly having PIH modules PGA 34 and DIP 38, leaded surface mount components PLCC 40 and SO 41, and leadless component 50. Table 1 describes in detail the process steps and parameters for a single sided PCB assembly having leaded PIH, leadless and leaded surface mount components as shown in FIG. 6.

TABLE 1

| PROCESS | DESCRIPTION | PARAMETERS |
| --- | --- | --- |
| SCREENING | solder paste screened on surface mount pads on the PCB | solder loaded flux 90% min metal (63Sn 37Pb) |
| ADHESIVE DISPENSE (optional) | curing adhesive used to hold components | UV or thermal curing, having elasticity at elevated temp. |
| ADHESIVE/ PASTE CURING (optional) | UV or thermal cure paste drying | vendor spec. & 7 min. minimum 80° C. for drying |
| COMPONENT PLACE LEADED, LEADLESS AND PIH | place all components into wet solder paste on the PCB | placement accuracy ± tol. determined by tool, component, pad size and PTH dia. |
| SOLDER PASTE DRYING | remove volatiles from solder loaded flux | 80° ± 5° C. for 45 ± 5 min. |
| SOLDER PASTE REFLOW | reflow solder using IR, vapor phase or convection heat | 205° ± 10° C. peak 30-90 sec. 183° C. appropriate ramp-up and cool-down time, temperature and spray determined by solvent used |
| CLEANING | vapor degrease using appropriate solvent for flux and ionic removal | |

The inventive process possesses many advantages, not the least of which is that a single solder application step is required for populating a printed circuit board with different types of components such as leaded, leadless, and surface mount. No crimping of the leaded pin-through-hole devices is required to retain them in position before permanent attachment as taught in the prior art. The component density is increased with this process as a PIH component can be placed at any position on the PCB. Typically in the prior art, PIH components must be placed in a restricted area along the PCB edge for wave soldering.

The attachment process described so far is for a single sided PCB assembly. This process may be used in a process for double sided attachment of a mixture of leaded surface mount, leadless, and pin in hole components.

We provide a double sided process which allows surface mounted devices to be attached to the top and bottom of the PCB, and PIH components to be attached to one side of the PCB. Double sided PCB assembly uses all the process steps described for single sided assembly; however the back side of the PCB is processed first.

Figure 7:
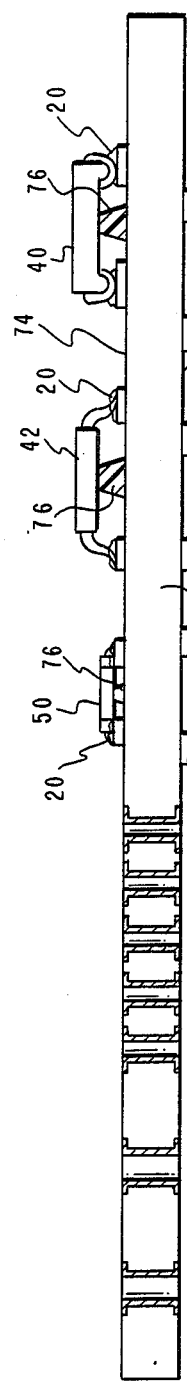
FIG. 7 is a side view of a double sided PCB with back side assembled.

Refer to FIG. 7, a side view of a double sided PCB 70 in the first stages of assembly, showing a first top or front side 72 and a second or back side 74. Leadless component 50, PLCC 40 and SO 42 are attached in the solder paste 20 and conventional adhesive 76. At this point a curing process may be used to secure the components to the PCB and partially cure solder paste 20. After curing, the assembly is flipped over for top side processing.

Figure 8:
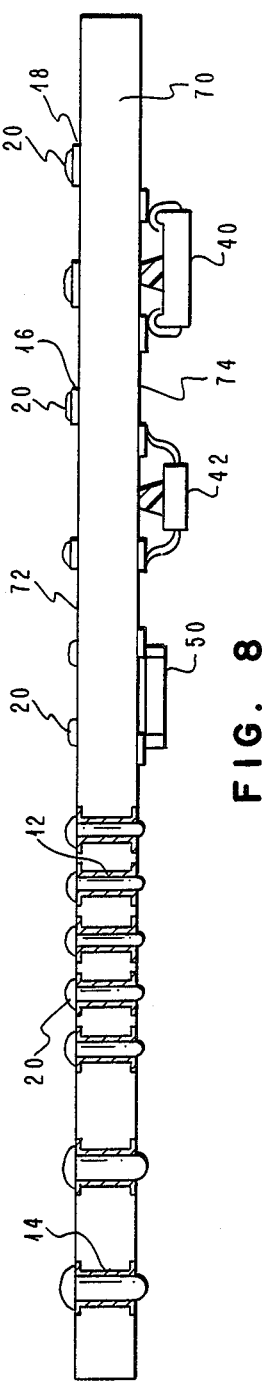
FIG. 8 is a side view of the double sided PCB with Solder paste applied to the top side.

FIG. 8 shows PCB 70 after the top side screening operation. Solder paste 20 is shown filling the PTHs 12 and 14 and deposited on surface mount pads 16 and 18. Bottom side 74 of PCB 10 is shown with surface mount components 40, 42 and 50. At this point the single sided assembly process steps described in connection with FIGS. 1-6 are repeated.

Figure 9:
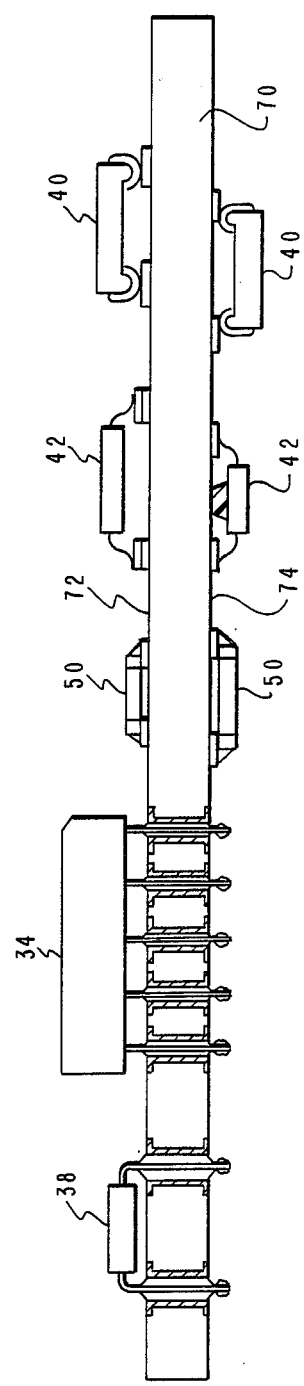
FIG. 9 is a side view of a double sided PCB ssembly with a variety of component types.

FIG. 9 is a completed double sided assembled PCB 70 having top side 72 PTH components PGA 34 and DIP 42, surface mount components 40, 42 and 50 mounted to both top side 72 and bottom side 74.

Table 2 describes in detail the process steps and parameters for the double sided PCB assembly shown in FIG. 9 having leadless and leaded surface mount components on both sides of the PCB and leaded PIH components on one side.

TABLE 2

| PROCESS | DESCRIPTION | PARAMETERS |
| --- | --- | --- |
| SCREENING (SIDE 1) | solder paste screened on surface mount pads on the PCB | solder loaded flux 90% min metal (63Sn 37Pb) |
| ADHESIVE DISPENSE | curing adhesive used to hold components | UV or thermal curing, having elasticity at elevated temp. |
| COMPONENT PLACE LEADED AND LEADLESS | place surface mount components into wet paste & adhesive | placement accuracy ± tol. determined by tool, component and pad size |
| ADHESIVE/ PASTE CURING | UV or thermal cure Paste drying | vendor spec. & 7 min. minimum 80° C. for drying |
| SCREENING (SIDE 2) | solder paste screened on surface mount pads and in PTH on the PCB | same solder as side 1. |
| COMPONENT PLACE LEADED, LEADLESS AND PIH | place all components into wet solder paste on the PCB | placement accuracy ± tol. determined by tool, component, pad size and PTH dia. |
| SOLDER PASTE DRYING | remove volatiles from solder loaded flux | 80° ± 5° C. for 45 ± 5 min. |
| SOLDER PASTE REFLOW | reflow solder using IR, vapor phase or convection heat | 205° ± 10° C. peak 30-90 sec. 183° C. appropriate ramp-up and cool-down time, temperature & spray determined by solvent used. |
| CLEANING | vapor degrease using appropriate solvent for flux and ionic removal. | |

While the invention has been shown and described having reference to a specific preferred embodiment those skilled in the art will understand that variations in form and detail may be made without departing from the spirit and scope of the invention.

What is claimed is:

1. An improved method of surface mountable components to both sides and leaded components to one side of a printed circuit board having first and second sides comprising the sequential steps of:

screening solder paste on lands for surface mount components located on the first side of the board;

depositing adhesive on surface mount components receiving sites located on the first side of the board;

placing the surface mount components on the first side of the board;

curing the deposited adhesive;

inverting the board;

screening solder paste on surface mount component lands and into the through hole locations on the second side of the board;

placing components on the second side of the board;

drying the screened solder paste;

reflowing the solder; and cleaning the board.

2. The method of claim 1 wherein the drying step comprises using convection heat for drying solder paste associated with all component types.

* * * * *